United States Patent [19]

Geschwind

[11] 4,331,258
[45] May 25, 1982

[54] SEALING COVER FOR AN HERMETICALLY SEALED CONTAINER

[75] Inventor: Gary I. Geschwind, Fremont, Calif.

[73] Assignee: Raychem Corporation, Menlo Park, Calif.

[21] Appl. No.: 240,645

[22] Filed: Mar. 5, 1981

[51] Int. Cl.³ .............................................. B65D 41/00
[52] U.S. Cl. .................................. 220/359; 220/200; 174/52 FP; 174/66; 174/52 S
[58] Field of Search ....................... 220/200, 359, 457; 174/52 S, 52 FP, 66, 120; 29/588; 156/330, 60, 306

[56] References Cited

U.S. PATENT DOCUMENTS

| Re. 30,348 | 7/1980 | Hascoe . | |
|---|---|---|---|
| 3,340,348 | 9/1967 | Clark et al. . | |
| 3,364,064 | 1/1968 | Wijburg . | |
| 3,515,950 | 6/1970 | Koons et al. . | |
| 3,538,597 | 11/1970 | Leinkram . | |
| 3,579,817 | 5/1971 | Boyle . | |
| 3,634,048 | 1/1972 | Koons et al. . | |
| 3,648,357 | 3/1972 | Green, Jr. . | |
| 3,665,592 | 5/1972 | Aspospors . | |
| 3,823,486 | 7/1974 | Hascoe . | |
| 3,874,549 | 4/1975 | Hascoe . | |
| 3,946,190 | 3/1976 | Hascoe . | |
| 3,949,122 | 4/1976 | Lepetit et al. . | |
| 4,020,987 | 5/1977 | Hascoe . | |
| 4,105,861 | 8/1978 | Hascoe . | |
| 4,109,818 | 8/1978 | Hascoe et al. | 220/200 |
| 4,126,758 | 11/1978 | Krumme . | |
| 4,190,176 | 2/1980 | Hascoe | 220/359 |
| 4,192,433 | 3/1980 | Hascoe . | |

FOREIGN PATENT DOCUMENTS 7608744 8/1976 Fed. Rep. of Germany .

Primary Examiner—George T. Hall
Attorney, Agent, or Firm—Derek P. Freyberg

[57] ABSTRACT

A sealing cover for an hermetically sealed container comprises an environmentally resistant metal lid, an intermediate plated metallic "picture frame", and a solder deposit metallurgically bonded to that "frame". Such a cover is particularly adapted for the sealing of semiconductor packages, and is especially advantageous in that it need not employ precious metals.

7 Claims, 3 Drawing Figures

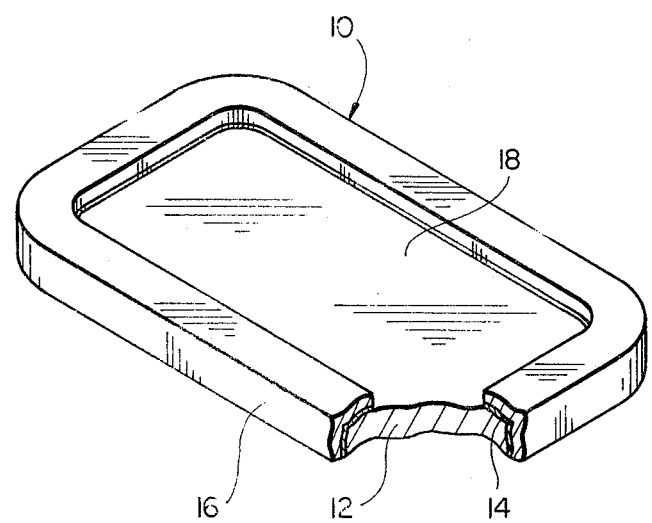
FIG_1
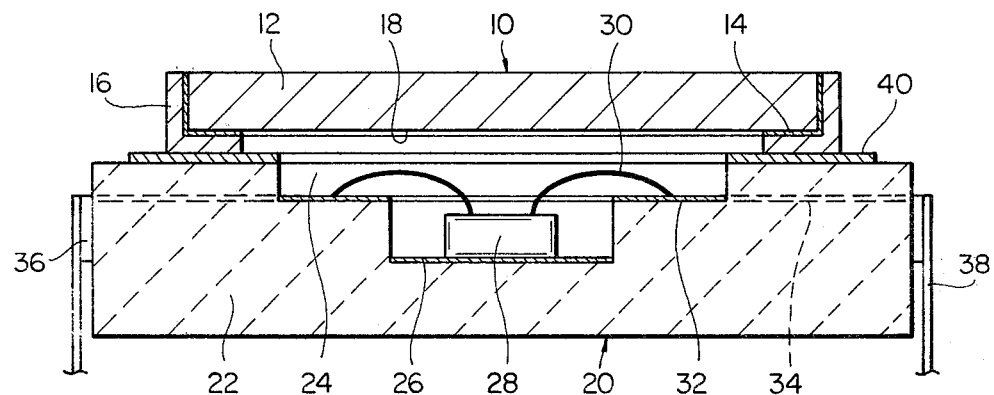
FIG_2
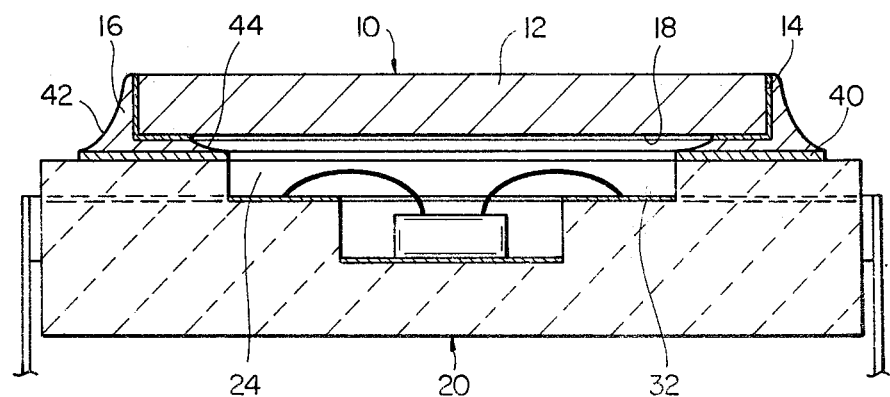
FIG_3

4,331,258

SEALING COVER FOR AN HERMETICALLY SEALED CONTAINER

BACKGROUND OF THE INVENTION

1. Field of the Invention

This invention relates to a sealing cover for use on an hermetically sealed container, especially one including a semiconductor device.

2. Discussion of the Prior Art

As is well known, it has become conventional to hermetically seal a semiconductor device in the cavity of a metallic or ceramic body to protect the device from adverse atmospheric effects and to provide physical protection. In the case of a ceramic body, a metallic ring is usually embedded in or fused into the body surrounding the cavity containing the semiconductor device. A metalic lid, to which has been attached a preformed ring of heat fusible material (solder), is placed over the cavity such that the fusible ring overlays the metallic ring on the ceramic body. The assembly is then clamped together and heated to form an hermetically sealed container for the semiconductor device.

In the embodiment of this design most popular in the semiconductor industry, the lid is made of Kovar (registered trade mark for a cobalt-nickel-iron alloy) or Alloy 42, (an iron—42% nickel alloy) which has been plated first with nickel and then with gold, and the solder is a gold-tin eutectic, while the outermost layer of the metallic ring on the ceramic body is also of gold.

Although Kovar is a suitable material for such lids by virtue of its coefficient of expansion being close to that of most ceramics, it has rather poor environmental resistance. For this reason, the gold plating is necessary both to prevent corrosion and also to provide a surface on the lid which is wettable by the gold-tin eutectic solder. However, recent decreases in the costs of manufacture of the semiconductor devices themselves and increases in the price of gold are making the use of precious metal plating and solders progressively less economic.

On the other hand, it is generally considered essential that the semiconductor device be hermetically sealed into its container and, consequently, that the materials of the container be environmentally resistant. It is unfortunately true that the mechanism protecting most metals and alloys (other than precious metals) from environmental and chemical attack also renders the surfaces of these metals resistant to effective cleaning by fluxes and thus relatively difficult to solder. Alternative approaches have been proposed, including the use of ceramic lids (CERDIP), and the use of shape memory alloys such as Tinel (a nickel-titanium alloy) (see, e.g., U.S. Pat. No. 4,126,758, assigned to the assignee of the present application). However, none of these alternatives have achieved commercial success and, despite the increase in cost, gold plated lids are still the norm in the semiconductor industry.

Further, it is still conventional in the art that the solder ring (mentioned previously) be manufactured separately from the lid and attached thereto, for example by spot welding. This approach suffers from the disadvantages that the solder ring may relatively easily separate from the lid proper, thus resulting in waste, and that substantial processing (melting, rolling, stamping, etc.) is required to form the ring.

DESCRIPTION OF THE INVENTION

Summary of the Invention

I have discovered that certain environmentally resistant metals, for example nickel-titanium alloys, may be used for semiconductor lids in conjunction with conventional lead-tin solders, provided that the lid has been treated to render it solderable. Such a treatment may consist in the selective metal plating of a "picture frame" about the circumference of one side and the edges of the lid, or onto any other area which it is desired to render solderable. Solder is then deposited and, if necessary, reflowed onto this treated area, and the lid may then be used in the conventional manner.

BRIEF DESCRIPTION OF THE DRAWING

FIG. 1 shows an example of a sealing cover of the present invention.

FIGS. 2 and 3 depict the use of the cover of FIG. 1. FIG. 2 depicts the lid in place on a ceramic semiconductor package, and FIG. 3 depicts the assembly after heating, whereby the semiconductor device has been hermetically sealed.

DETAILED DESCRIPTION OF THE PREFERRED EMBODIMENT

As used herein, the term "solder" refers to any metal or metallic alloy used to join metallic surfaces by fusion of the metal alloy between the surfaces and subsequent cooling to solidification. Unless the context otherwise requires, "solder" or "soft solder" refers in general to alloys in which the primary constituents are lead and/or tin.

FIG. 1 depicts, in a partially cut-away perspective view, an embodiment of the sealing cover of the present invention. The sealing cover shown generally at 10 comprises a lid 12, which is made of an environmentally resistant metal, a metal plate "picture frame" 14 on the circumference of one side and the edges of said lid, and a solder ring 16 adherent to and covering said "picture frame". The surface of the lid 18 within the "picture frame" is free of solder. The sealing cover has been depicted in FIG. 1 as being rectangular, however, this depiction is not intended to be limiting, and the cover may be of any configuration, such as square, circular, etc., suitable to its intended purpose. Typical cover dimensions could be: lid area, from about $\frac{1}{4}$" square to about $\frac{1}{2}$" square; lid thickness 10 mils; plating thickness 50-100 microinches; width of picture frame, 50 mils; and thickness of solder deposit, 2-10 mils.

FIGS. 2 and 3 depict, in cross-sectional view, the use of the cover of FIG. 1 to seal a ceramic semiconductor package. The semiconductor package shown generally at 20 comprises a ceramic base 22 having a stepped central recess 24. The bottom of this recess is covered with a metallic layer 26, on which is placed a semiconductor device 28. Lead bond wires 30 connect the device to a metallic lead frame 32 from which leads 34 pass through the ceramic body to its sides, where they are joined by brazed joints 36 to legs 38. A metallic sealing ring 40 has been embedded in or fused to the upper surface of the ceramic body.

In FIG. 2, the cover 10 is shown in place before sealing, with the solder ring 16 located on the sealing ring 40. A clamp, not shown, is then used to hold the cover and body together, and the assembly is heated.

FIG. 3 depicts the assembly after heating to a temperature sufficient to fuse the solder. The solder 16 has fused to form a seal between the "picture frame" 14 and the metallic sealing ring 40, and the adequacy of the seal formed thereby may be visually determined by examination of the external solder fillet 42 which has been formed. Because the inner surface 18 of the cover is not wetted by solder, an internal fillet 44 is also formed between the frame 14 and sealing ring 40, and excess solder does not make its way into cavity 24, thereby minimizing the chances of short-circuits between the cover and, e.g., the lead frame 32.

While the embodiment of FIG. 1 shows the metal plating and the solder ring fused thereto as a "picture frame" about the circumference of one side and the edges of the lid, it is within the contemplation of my invention that the plating and solder ring should be of any closed configuration, limited only by the constraints of the body to which the cover is to be sealed, and not by the configuration of the periphery of the lid. The "picture frame" configuration shown, however, provides maximum visual examination of the seal.

The essence of this invention lies in the following factors:

(1) The choice of a metal for the lid which displays good environmental resistance without further treatment such as plating, (2) the provision of an adherent intermediate layer, which is solder wettable, about the periphery of the lid, and (3) the use of a soft, non-previous metal, solder.

(1) implies that the metal should be capable of use as a lid without further treatment. By "environmentally resistant" is meant that the metal should not corrode, discolor, or aid in the corrosion or discoloration of other parts of the assembly. It is a requisite of the semiconductor industry, though not essential to this invention per se, that any deposit forming on the surface of the lid should not be of such a color or type as to interfere with the legibility of part numbers, which are usually imprinted on the surface of the lid.

Table I shows some metals and alloys suitable for the lid, together with some comparative examples.

TABLE I

| Metal/Alloy | Solder-ability | Environmental Resistance | $\alpha$ ($\times 10^{-6}$/°C.) | Relative Cost |
| --- | --- | --- | --- | --- |
| Tinel | Poor | Good | 10.5 | Moderate |
| Titanium Alloys | Poor | Fair/Good | ~10 | Moderate |
| Tantalum Alloys | Poor | Fair/Good | 6.5 | High |
| Niobium Alloys | Poor | Fair/Good | ~7 | High |
| Molybdenum Alloys | Poor | Fair/Good | ~5 | High |
| Tungsten Alloys | Poor | Fair/Good | 4.5 | High |
| Nickel | Fair/Good | Good | 13.3 | Low/Moderate |
| 300 Series Stainless Steel | Fair | Good | 9 | Low |
| Invar | Fair | Poor | ~1.0 | Moderate |
| Kovar | Poor | Poor | 5.6 | Moderate/High |
| Alloy 42 | Poor | Poor | 4.8 | Low |
| Platinum | Good | Excellent | 9 | Very High |

Ceramics generally have a coefficient of thermal expansion, $\alpha$, of about $4 \sim 5 \times 10^{-6}$/° C. The optimum $\alpha$ for the lid is, of course, the same as that of the body so that thermal stresses are minimized. Most metals, however, have values about twice that of ceramic or higher.

The maximum acceptable $\alpha$ will depend on the temperatures which will be used for soldering and to which the package must remain sealed, and will also depend on the extent to which the solder sealing the lid to the body can absorb thermal stress.

A further requisite of the metal of the lid is that it should be capable of being fabricated at reasonable cost, i.e. that the metal or alloy should not be too expensive, and that it should be easily rolled into sheet of the appropriate thickness and stamped or otherwise cut to the required shape.

Of the metals/alloys in Table 1, the first eight are potentially acceptable as a material for the lid, while Invar, Kovar, and Alloy 42 do not possess the necessary environmental resistance. Platinum, like other precious metals, is quite suitable except for cost, and cost reduction is a primary aim of this invention. Of those alloys which are potentially acceptable (and Table I merely exemplifies a few of these and is not intended to be exhaustive), the choice must be made on tradeoffs between the factors listed in the table, as no alloy combines all of the desired features. Such determination of the optimum material for a particular application is considered within the ability of the skilled art-worker having regard to his own knowledge and with this disclosure before him.

As materials which meet the criteria of (1) above are generally of very low solderability, (2) implies that a solderable area must be created on the lid, generally in a "picture frame" about the circumference of one side and around the edges. This solderable area may be created, for example, by selective metal plating of the desired area (although it should be noted that most of these environmentally resistant metals are also relatively difficult to plate), or by other suitable means.

The choice of a metallic intermediate layer or layers is controlled by three main factors—cost, platability, and solderability. The cost factor is what makes precious metals undesirable, as has been previously slated, though they meet the other two criteria. The ability to form a coherent and adherent plating will depend on both the metal to be used for the plating, and on the lid metal, and the choice of suitable metals should be within the scope of one skilled in the art, having regard to the disclosure herein. The metal to be plated should also be solderable by conventional methods, and this will preclude the use of, for example, chromium. The plating is generally applied to a thickness of 50 to 100 microinches. An exemplary plating metal is nickel, which is of comparatively low cost, will plate onto e.g. Tinel, and is solder-wettable. Multi-layer plating, e.g. a nickel layer topped with a thin layer of silver or other easily solderable metal, is also within the scope of this invention.

The solder coating, which is metallurgically bonded to the plated layer, may be formed by any suitable means. Exemplary methods include the application of liquid solder (with or without flux), such as by dip coating in one or more solder baths; electroplating of a solder layer; or "printing" of a solder/flux paste onto the "picture frame", followed by heating to reflow the solder. Of course, any method using flux will require that the sealing cover when made should be cleaned free of flux residue, as such residue may contaminate the interior of the container to be sealed.

The advantage of a lid metal of low solderability appears also at this point, since then the whole lid may be treated with solder, which will adhere only to that part of the lid which has the intermediate layer.

A special advantage of the use of soft solder rather than the conventional gold-tin eutectic (quite apart from the cost saving) is that soft solders, unlike the gold-tin solders, have a much greater ability to absorb thermal strain caused by differential thermal expansion between the sealing cover and the ceramic base. This means that metals having a coefficient of thermal expansion rather greater than that of ceramic may still be used without introducing undesirable thermal stress into the finished product.

Although my invention has been described specifically with reference to the sealing of semiconductor packages, it is to be understood that it is applicable to the hermetic sealing of any container, and no limitation as to purpose is intended by the foregoing description. Other arrangements which may be devised by those skilled in the art in view of this disclosure are to be considered as within the scope and spirit of the invention, which is limited solely by the appended claims.

What is claimed is:

1. A sealing cover for hermetically sealing a container, comprising:
   (a) an environmentally resistant metallic lid;
   (b) an intermediate layer comprising metal plating on only that part of the surface of said lid which is to be rendered solderable; and
   (c) a layer of solder disposed on said intermediate layer and metallurgically bonded thereto.
2. A sealing cover as in claim 1 wherein the metal comprising said lid is selected from the group consisting of nickel-titanium alloys, titanium alloys, tantalum alloys, niobium alloys, molybdenum alloys, tungsten alloys, nickel, and 300 series stainless steels.
3. A sealing cover as in claim 2 wherein the metal comprising said lid is a nickel-titanium alloy.
4. A sealing cover as in claim 1 wherein the intermediate layer comprises nickel plating.
5. A sealing cover as in claim 1 wherein the solder comprises a predominantly non-precious metal alloy.
6. A sealing cover as in claim 5 wherein the solder comprises a predominantly tin-lead alloy.
7. A sealing cover as in claim 1 wherein the intermediate layer and solder layer lie on a picture frame about the circumference of one side and the edges of the lid.

* * * * *